(12) United States Patent
Yeh

(10) Patent No.: US 8,800,478 B2
(45) Date of Patent: Aug. 12, 2014

(54) FILM FORMATION SYSTEM AND FILM FORMATION METHOD

(75) Inventor: Cheng-Kuo Yeh, Taipei (TW)

(73) Assignee: Aurotek Corporation, Taipei (TW)

( * ) Notice: Subject to any disclaimer, the term of this patent is extended or adjusted under 35 U.S.C. 154(b) by 691 days.

(21) Appl. No.: 12/891,939

(22) Filed: Sep. 28, 2010

(65) Prior Publication Data

US 2011/0159700 A1 Jun. 30, 2011

(30) Foreign Application Priority Data

Dec. 31, 2009 (TW) .............................. 98146226 A

(51) Int. Cl.
*B05C 3/02* (2006.01)
*B05C 3/09* (2006.01)
*B05D 1/20* (2006.01)
*B82Y 30/00* (2011.01)
*B82Y 40/00* (2011.01)

(52) U.S. Cl.
CPC ... *B05C 3/02* (2013.01); *B05C 3/09* (2013.01); *B05D 1/206* (2013.01); *B82Y 30/00* (2013.01); *B82Y 40/00* (2013.01)
USPC ............................. 118/402; 118/428; 118/429

(58) Field of Classification Search
CPC ............. B05C 3/02; B05C 3/09; B05D 1/206
USPC .................... 118/402, 428, 429; 264/82, 129; 216/42; 977/856, 857; 425/6, 86
See application file for complete search history.

(56) References Cited

U.S. PATENT DOCUMENTS

| | | | | |
|---|---|---|---|---|
| 1,956,561 | A | * | 5/1934 | Coates .......................... 118/126 |
| 4,779,562 | A | * | 10/1988 | Ono .............................. 118/402 |
| 4,783,348 | A | * | 11/1988 | Albrecht et al. ............... 427/402 |
| 2005/0271808 | A1 | * | 12/2005 | Reust et al. .................... 427/230 |
| 2009/0233445 | A1 | * | 9/2009 | Lee et al. ....................... 438/694 |

* cited by examiner

*Primary Examiner* — Laura Edwards
(74) *Attorney, Agent, or Firm* — Amin, Turocy & Watson, LLP

(57) ABSTRACT

A film formation system and a film formation method are disclosed. The film formation method includes the following steps performed in the film formation system that includes a container containing liquid, a liquid draining device for draining the liquid, a ring-shaped component installed in the container, and a carrying component installed in the liquid in the container for carrying at least a substrate: enabling the carrying component in the liquid and enabling the ring-shaped component to float on the liquid; when a film layer that is composed of nano-spheres is formed on the liquid, locating the film layer in a ring of the ring-shaped component; and removing the liquid, allowing the film layer to move downward in accordance with the ring-shaped component and be formed on the substrate, thereby preventing the nano-spheres from contacting an inner wall of the container and bursting, through the installation of the ring-shaped component.

18 Claims, 8 Drawing Sheets

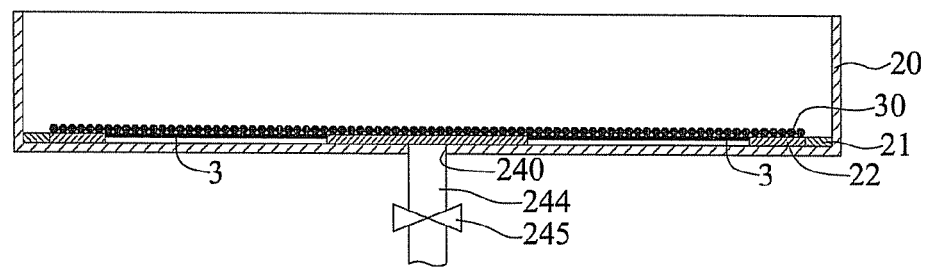
FIG.3D'
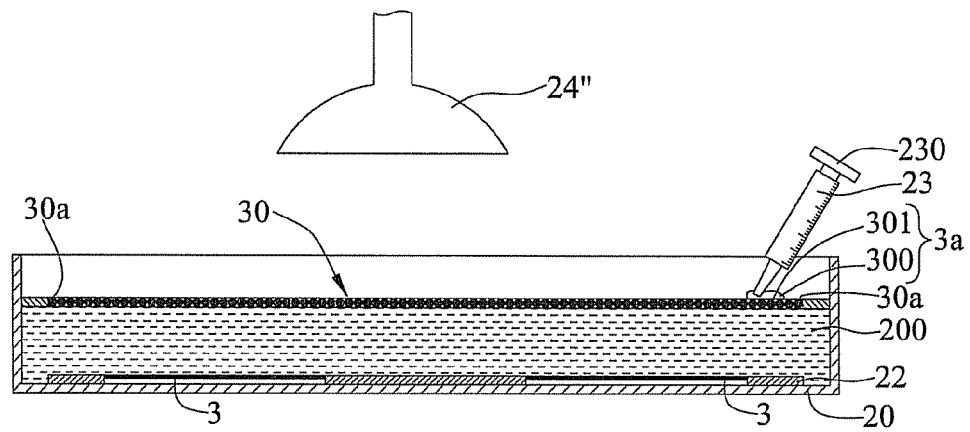
FIG.3D"

FILM FORMATION SYSTEM AND FILM FORMATION METHOD

BACKGROUND OF THE INVENTION

1. Field of the Invention

The present invention relates to film formation systems and film formation methods, and, more particularly, to a system for manufacturing a photoelectric element.

2. Description of Related Art

Currently, the photoelectric conversion efficiency of a representative semiconductor photoelectric element, such as a light emitting diode (LED) or a solar cell, is one of the most significant efficiency indexes, as far as device efficacy is concerned. Related to the conversion efficiency, an even and smooth surface may have a higher light reflection rate, as compared to an uneven surface. As such, an uneven surface is advantageous. To effectively raise the conversion efficiency, a manufacturer may fabricate an uneven microstructure that includes concave and convex portions on a surface of the element. As a result, the roughness of the surface of the element has a significant influence on the conversion efficiency. In general, the microstructure is composed of ordered and disordered microstructures. A disordered microstructure is achieved by a chemical etching process, while an ordered microstructure is achieved by a resist lithography process.

In the prior resist lithography process, a dried film is formed on a surface of a wafer and acts as a photomask, then photomask holes are formed with the use of exposure and development processes to expose a part of surface of the wafer, a micro-etching process is then performed in the photomask holes to roughen the exposed surface of the wafer, and finally the dried film is removed. However, the prior resist lithography process has a long manufacturing time, and the dried film has a high cost and is likely to contaminate the environment. Accordingly, a photomask composed of nano-spheres has been developed to replace the dried film. Such a photomask has low cost, is environment-friendly, and has a short manufacturing time.

According to the prior art, the photomask composed of the nano-spheres is manufactured in an immersion-startup way. Initially, a container is filled with a liquid having a plurality of nano-spheres. Then, a wafer is immersed into the liquid, allowing the nano-spheres to gather on a surface of the wafer. Finally, start up movement of the wafer, allowing the nano-spheres to be adhered to the surface of the wafer and form a photomask composed of the nano-spheres. However, the speed for the wafer to be started up at is closely related to the tightness of the photomask. Too high a startup speed causes the nano-spheres to be unable to be adhered to the surface of the wafer, and the photomask may have a large breach, which results in the formation of a large concave portion, rather than a microstructure, during a subsequent etching process. Too low a startup speed causes the nano-spheres to be stacked on the surface of the wafer in a multi-layered form, which results in difficulty forming a breach on the photomask and forming a microstructure during a subsequent etching process. In this regard, a wafer manufacturing process is developed without considering the startup speed.

FIGS. 1A-1E illustrate a film formation method adopting nano-sphere lithography according to the prior art. As shown in FIG. 1A, a container 10 having a diameter of 15 cm is provided. Water 100 is injected into the container 10. Then, as shown in FIGS. 1B and 1C, an injector or a pipette contacts the water surface, and injects along the water surface ethanol solution 300a (having a concentration of 10% or 8%) having a plurality of nano-spheres 301, allowing the nano-spheres 301 to be scattered loosely on the water surface. The ethanol solution 300a pulls the nano-spheres 301 to move toward an edge of the container 10, allowing the nano-spheres 301 to gather and form a film layer 30' having an opening, for use as a required photomask film. As shown in FIG. 1D, a substrate 3 (which is a 1 cm$^2$ wafer) is placed through the opening 302 into the water 100 contained in the container 10, with the surface of the substrate 3 exactly opposing to and contacting the bottom of the film layer 30', allowing the film layer 30' to be engaged with the surface of the substrate 3. Then, as shown in FIG. 1E, the substrate 3 is removed by lifting upwards from the water surface, allowing the surface of the substrate 3 to have the film layer 30' that acts as a photomask. Subsequently, an etching process to roughen the surface may be performed.

However, though the aforesaid nano-sphere lithography process need not take the startup speed into consideration, the process cannot manufacture a photomask on a wafer having a large area, but only on a wafer having a small area, such as 1 cm$^2$. Therefore, the demand for larger-sized areas is not satisfied.

Additionally, the film layer 30' on the water surface in the container 10 has to have a space (e.g., the opening 302) reserved for release pressure. Because the nano-spheres 301 may not occupy the whole water surface, or the nano-spheres 301 may contact the inner wall 10a of the container 10 and burst, the nano-spheres 301 may occupy as much as 70% of the water surface. Therefore, a photomask required for a wafer having a large area may not be produced. If the nano-spheres 301 occupy the whole water surface, as in the step shown in FIG. 1D, the substrate 3 cannot be placed into the water 100 without disturbing the film layer 30'. If attempted, the film layer 30' can exhibit damage, like a cracked lattice, which affects the adhering force of the nano-spheres 301.

Therefore, finding a way to prevent the aforesaid problems of the prior art has become one of the most urgent issues in the art.

SUMMARY OF THE INVENTION

In view of the above-mentioned problems of the prior art, the present invention provides a film formation system including: a container containing liquid; a liquid draining device for draining the liquid; a ring-shaped component installed in the container and floating on the liquid, for moving upward and downward freely; a carrying component installed in the liquid in the container, for carrying at least a substrate; and a film formation material that is injected on the surface of the liquid in the container to form a film layer having an edge contacting the internal-diameter wall of the ring-shaped component.

The aforesaid film formation system may further include a transferring device for containing the film formation material. The transferring device has an injection unit for injecting the film formation material into the container.

In the aforesaid film formation system, the liquid draining device has a water draining hole penetrating the container, and a plug for plugging the water draining holes. The liquid draining device may also include a water draining pipe connected to the water draining holes for guiding the flow direction of the liquid and a stop valve for controlling the flow rate of the liquid. The liquid draining device may further have an evaporator. The liquid draining device may also include a pipe body that enters the container and drains water.

The aforesaid film formation system may further include a separation structure for separating the carrying component from the container. The separation structure has a clamping part installed on the carrying component, allowing a robotic arm to clamp the carrying component and separate the carrying component from the container. A gap is formed between the container and the carrying component, for the robotic arm to easily clamp the carrying component.

The present invention further discloses a film formation method that is applied to the aforesaid film formation system and includes the following steps of: injecting liquid into the container to enable the ring-shaped component to float on the liquid and the carrying component to be in the liquid; injecting a film formation material on the surface of the liquid and forming a film layer in the ring-shaped component on the liquid, the film layer having an edge contacting the internal-diameter wall of the ring-shaped component; and removing the liquid to enable the film layer to move downward in accordance with the ring-shaped component and form on the carrying component and the substrate that is installed on the carrying component.

In the film formation system and method of the present invention, the container is a circular, hexagonal or a polygonal container; the ring-shaped component is preferably in the shape of a leaf; the ring-shaped component has an external-diameter edge corresponding to an inner wall of the container; the carrying component has a contour corresponding to the internal-diameter edge of the ring-shaped component; the carrying component may comprise hydrophilic material or stainless steel; and the carrying component preferably has a rough surface.

In an embodiment, the substrate is a wafer.

In the aforesaid film formation method, when the ring-shaped component is installed in the container, the external-diameter edge of the ring-shaped component contacts the inner wall of the container.

In the aforesaid film formation method, when the carrying component and the ring-shaped component are installed in the container, the contour of the carrying component contacts the internal-diameter edge of the ring-shaped component.

In an embodiment of the present invention, the liquid is water; the film layer is deposited on the substrate; and the film formation material comprises nano-spheres and an aqueous alcohol solution.

In the aforesaid film formation method, a transferring device transfers the film formation material into the container, and the transferring device has an injection unit for injecting the film formation material into the container.

In the aforesaid film formation method, the liquid is removed by a siphon. The film formation method further comprises using an evaporator to dry the film layer after the liquid is removed.

The aforesaid film formation method further includes using a separation structure to separate the carrying component from the container after the liquid is removed.

It can be known from the above that the present invention, through the installation of the ring-shaped component, may effectively prevent the nano-spheres from contacting the inner wall of the container and bursting, and the nano-spheres may be formed within the ring of the ring-shaped component, such that a photomask required for a wafer having a large area may be manufactured.

Moreover, the present invention first installs the carrying component on the bottom of the container, and then forms the film layer on the water surface, in order to prevent the carrying component from damaging the film layer. The present invention does not need to form an opening for the carrying component to be installed in, and the nano-spheres may have a larger disposition area. Through the design of the carrying component, a photomask required for a wafer having a large area may be manufactured at one time, and demands for various options may be satisfied effectively.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention and its advantages, these and other advantages and effects being readily understandable by those in the art after reading the disclosure of this specification. The present invention can also be performed or applied by other embodiments. The details of the specification may be on the basis of a particular viewpoint or application, and numerous modifications and variations can be devised without departing from the spirit of the present invention.

Figure 1A:
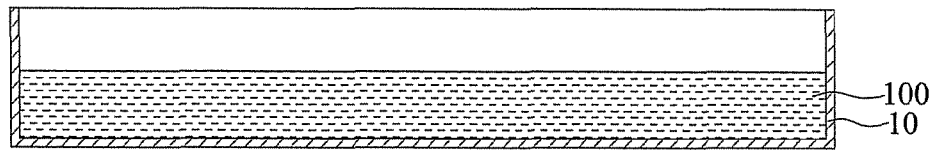
FIGS. 1A, 1B, 1D and 1E are cross-sectional diagrams
Figure 1B:
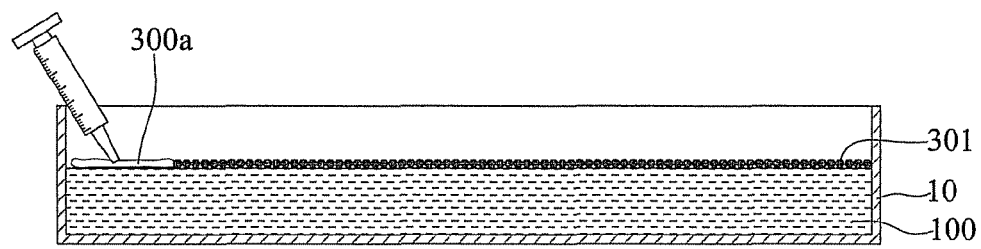
Figure 1C:
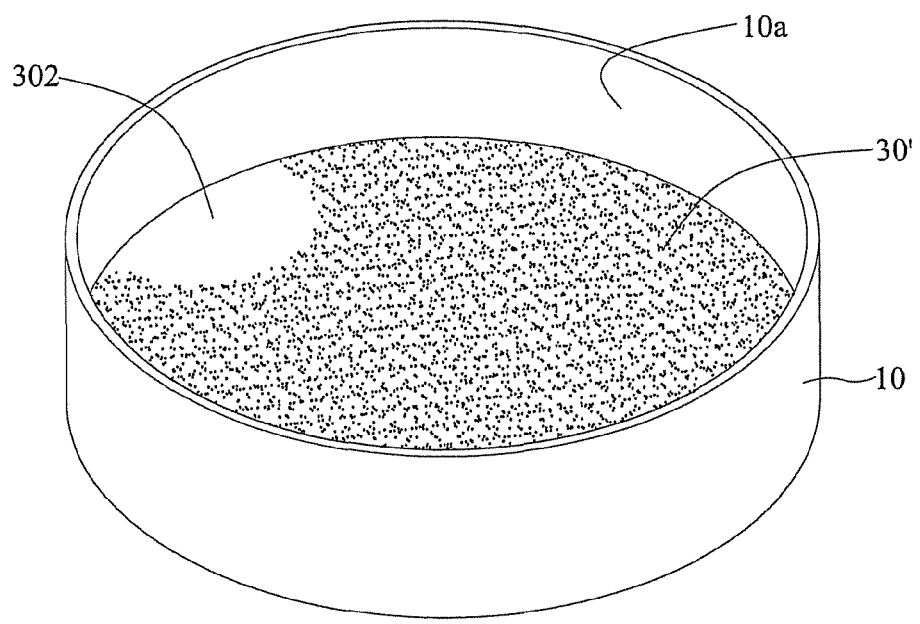
FIG. 1C is a perspective diagram all illustrating a film formation method adopting a nano-sphere lithography according to the prior art.
Figure 1D:
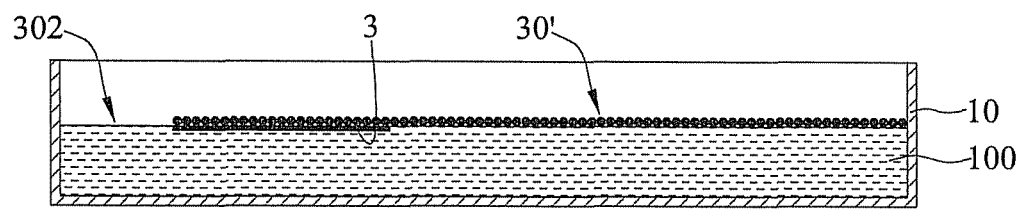
Figure 1E:
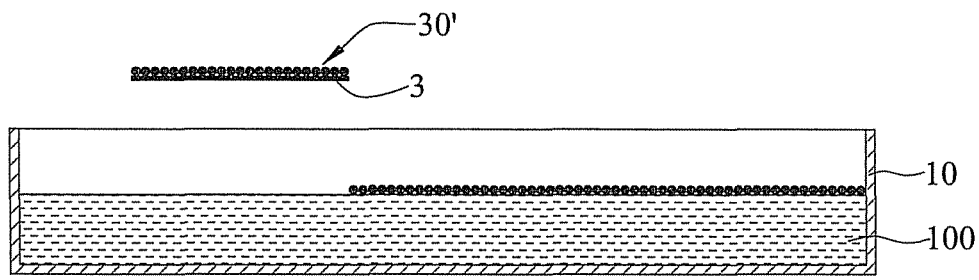
Figure 2:
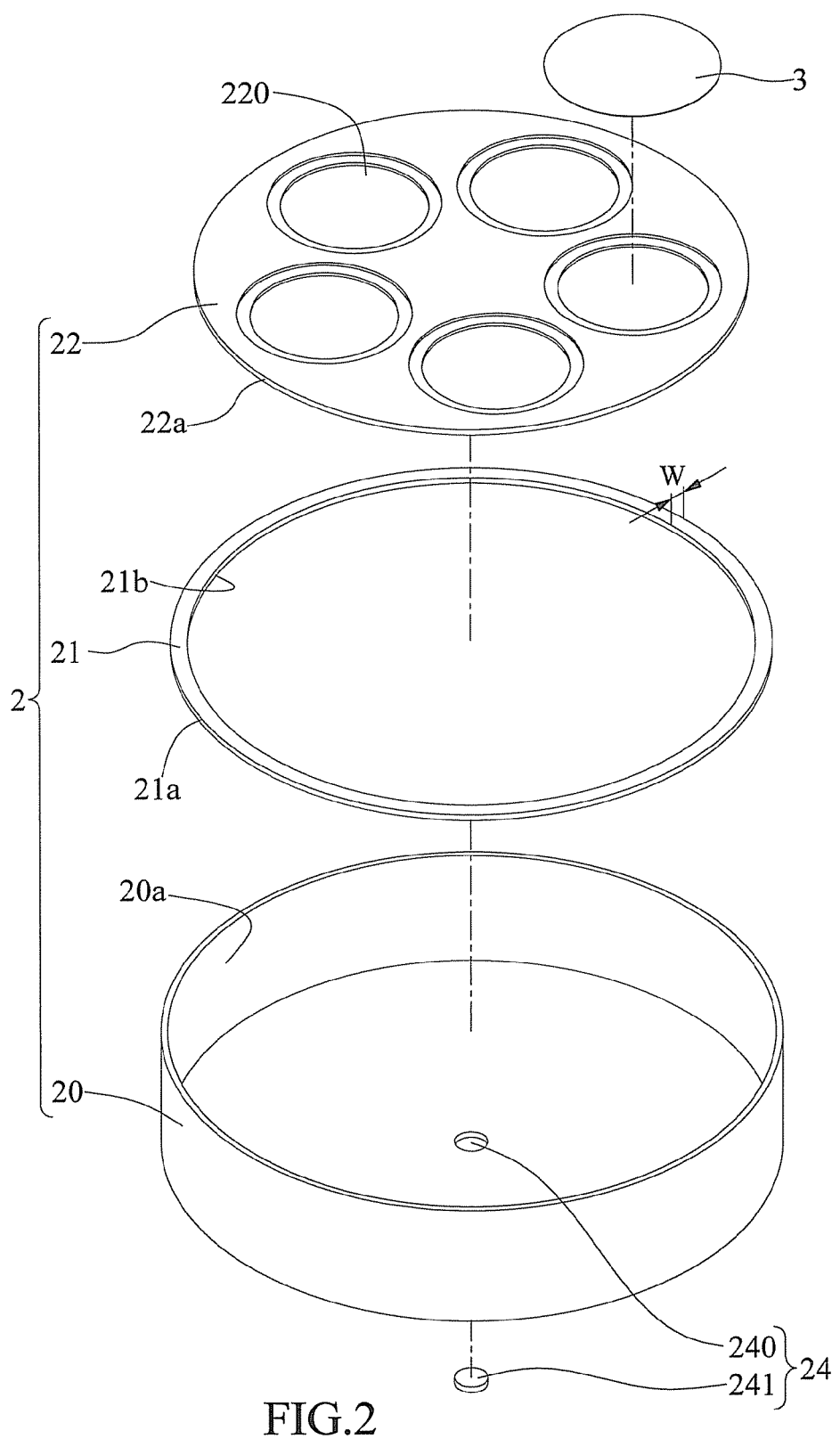
FIG. 2 is an exploded view of a film formation system according to an embodiment of the present invention.

FIG. 2 shows a film formation system 2 according to an embodiment according to the present invention. Please also refer to FIGS. 3A-3E, which are cross-sectional diagrams illustrating a film formation method applied to the film formation system 2. Also, please refer to FIGS. 4A-4C, which show the film formation system 2 of other embodiments. The film of the present invention may be used as an etching mask or used for other purposes. In the manufacturing process, a nano-sphere self-assembly technique is employed, without the use of a dry film with toxicity and an exposure apparatus.

Figure 3A:
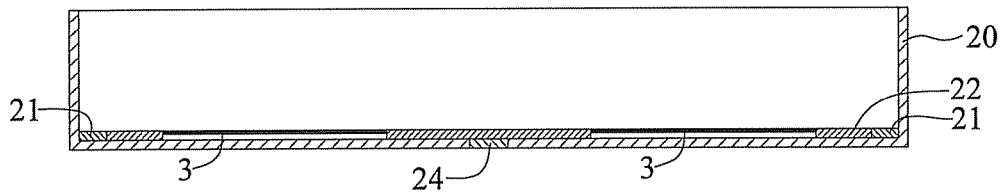
FIGS. 3A-3E are cross-sectional diagrams illustrating a film formation method according to an embodiment of the present invention.

As shown in FIGS. 2 and 3A, the film formation system 2 of the present invention is provided for manufacturing a film such as a photomask on a substrate 3 such as a two-inch wafer. The substrate 3 may be used for an LED device. The film formation system 2 comprises a container 20, a ring-shaped component 21 and a carrying component 22. The assembly sequence of the film formation system 2 is: first installing the ring-shaped component 21 in the container 20, and then installing the carrying component 22 that carries at least a substrate 3 in the container 20, or vice versa.

The container 20 is circular, hexagonal or polygonal, and preferably circular. The ring-shaped component 21 has a leaf-like thickness and has a width w of about 5 mm (see FIG. 3). The ring-shaped component 21 has an external-diameter edge 21a corresponding to an inner wall of the container 20. Preferably, when the ring-shaped component 21 is installed in the container 20, the external-diameter edge 21a of the ring-shaped component 21 is in contact with the inner wall 20a of the container 20.

The carrying component 22 is a disc having a radius of 20 cm and a rough surface. The carrying component 22 comprise a hydrophilic material or stainless steel, but is not limited thereto. The carrying component 22 has a contour 22a corresponding to the internal-diameter edge 21b of the ring-shaped component 21. Preferably, when the carrying component 22 and the ring-shaped component 21 are installed in the container 20, the contour 22a of the carrying component 22 is in contact with the internal-diameter edge 21b of the ring-shaped component 21.

The carrying component 22 may carry a substrate in a wide variety of manners. In the embodiment, a plurality of holes 220 corresponding to the substrate 3 are formed in the carrying component 22, for the substrate 3 to be engaged therein. Accordingly, the carrying component 3 carries a plurality of the substrates 3. The carrying component 22 may be configured with various numbers of the holes 220, depending on the requirements of the substrate 3 being processed.

Figure 3B:
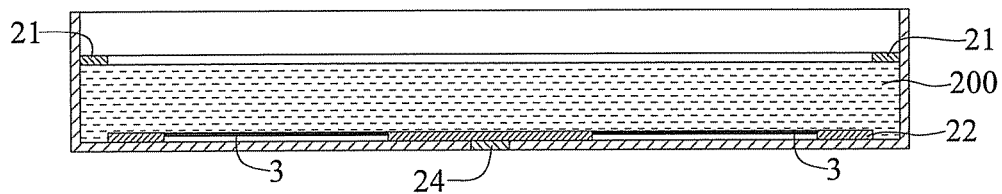

As shown in FIG. 3B, a liquid 200 such as water is injected into the container 20, allowing the ring-shaped component 21 to float on the liquid 200 and the carrying component 22 to be in the liquid 200. In the embodiment, the liquid 200 is not limited to water. However, if using water, it must be relatively clean, such that tap water is not suitable for the embodiment of the present invention.

Figure 3C:
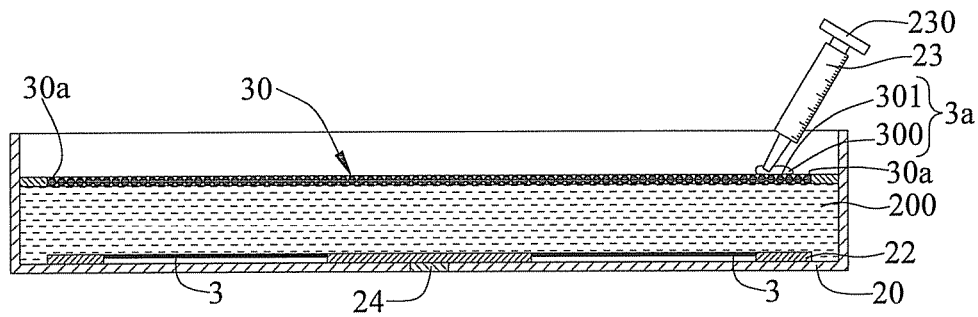

As shown in FIG. 3C, a film formation material 3a is injected into the container 20, to form on the liquid 200 a thin film layer 30 that is composed of the film formation material 3a. The film layer 30 is located within the ring of the ring-shaped component 21, and the film layer 30 has an edge 30a contacting the internal-diameter edge 21b of the ring-shaped component 21.

The film formation material 3a comprises nano-spheres 301 and aqueous alcohol solution 300 having a surface tension great enough for the film formation material 3a to form a film on top of the liquid 200. In the embodiment, the aqueous alcohol solution 300 is ethanol (ethanol has a surface tension of 22 mN/m, and ethanol solution with ethanol and water in a ratio of 1:1 has a surface tension of 30 mN/m). The film layer 30 is composed of a plurality of closely arranged nano-spheres 301. Optionally, the aqueous alcohol solution 300 may be provided to disperse the nano-spheres 301, allowing the nano-spheres 301 to be disposed on the water evenly in accordance with the aqueous alcohol solution 300.

Preferably, the film formation system 2 further comprises a transferring device 23 for containing the film formation material 3a. In the embodiment, the transferring device 23 is an injector having an injection unit 230, to inject the film formation material 3a along the water in the container 20. The aqueous alcohol solution 300 floats on the liquid 200, enabling the plurality of nano-spheres 301 to gather and form the film layer 30 that floats on the liquid 200.

Through the installation of the ring-shaped component 21, the embodiment of the present invention effectively prevents the nano-spheres 301 from contacting the inner wall 20a of the container 20, and the ring-shaped component 21 has the thickness of a very thin leaf. In the embodiment, the ring-shaped component 21 is 0.5 mm thick, and the nano-spheres 300 have a diameter of 1 μm. If the ring-shaped component 21 is too thick, the nano-spheres 300 may adhere upward along a wall of the internal-diameter edge 21b of the ring-shaped component 21, causing the edge of the film layer 30 to be warped and thus cracking the film layer 30.

Further, the width w of the ring-shaped component 21 is far smaller than the size of the container 20, and the area of the hollow part of the ring of the ring-shaped component 21 is close to the size of the container 20, enabling the disposition area for the nano-spheres 301 to be far larger than in the prior art. In the embodiment, the nano-spheres 301 occupy an area as high as 95% of the water surface, such that it is capable of forming a film required for a wafer having a large area.

The embodiment of the present invention first installs at the bottom of the container 20 the carrying component 22 and the substrate 3, and then forms the film layer 30 on the wafer surface. Therefore, the situation of the prior art in which the film layer is ruined as a substrate is placed into the water does not occur, the film layer 30 maintains its structure, and the adhering force of the nano-spheres 301 is not diminished.

The installation of the carrying component 22 and the substrate 3 at the bottom of the container 20 also avoids the situation of the prior art in which an opening needs to formed for the substrate to be place in. Accordingly, the installation of the substrate 3 does not affect the disposition area of the nano-spheres 301 on the wafer surface, and the nano-spheres 301 may be disposed to cover nearly all the hollow part of the ring of the ring-shaped component 21.

Figure 3D:
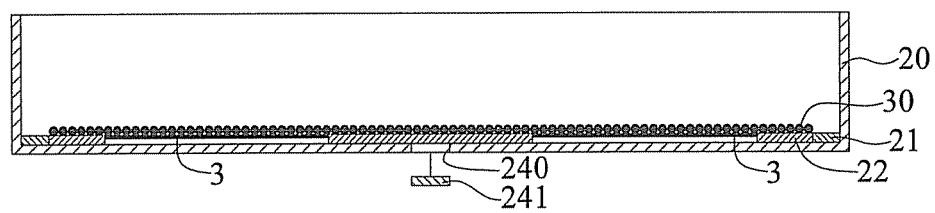

As shown in FIG. 3D, the liquid 200 and the aqueous alcohol solution 300 are removed, enabling the film layer 30 to move downward in accordance with the ring-shaped component 21 and be deposited on the carrying component 22 and the substrate 3, wherein the moving of the ring-shaped component 21 downward to the bottom of the container 20 enables the internal-diameter edge 21b of the ring-shaped component 21 to contact the contour 22a of the carrying component 22, while the film layer 30 moves downward to the substrate 3 only because the film layer 30 is located within the ring of the ring-shaped component 21.

There are many ways, e.g., by way of sucking, to remove the liquid 200 and the aqueous alcohol solution 300. Preferably, as in the film formation system 2 shown in FIG. 2, the container 20 is installed with a liquid draining device 24 at its bottom for draining the liquid 200 and the aqueous alcohol solution 300. The liquid draining device 24 has a water draining hole 240 penetrating the container and a plug 241 for plugging the water draining hole 240. However, as shown in FIG. 3D', a water draining pipe 244 that guides the flow direction of the liquid and a stop valve 245 that controls the flow rate of the liquid may be used. In the embodiment, when the plug 241 is removed from the water draining hole 240 of the container 20, the liquid 200 and the aqueous alcohol solution 300 are drained from the water draining hole 240, out the container 20, and into the water draining pipe.

In an embodiment, as shown in FIG. 3D", the liquid draining device 24 further comprises an evaporator 24" that evaporates the residue of the liquid located on the film layer 30, the ring-shaped component 21 and the carrying component 22. Optionally, the water draining hole 240 may be not installed, and the liquid 200 and the aqueous alcohol solution 300 is evaporated directly.

Figure 4A:
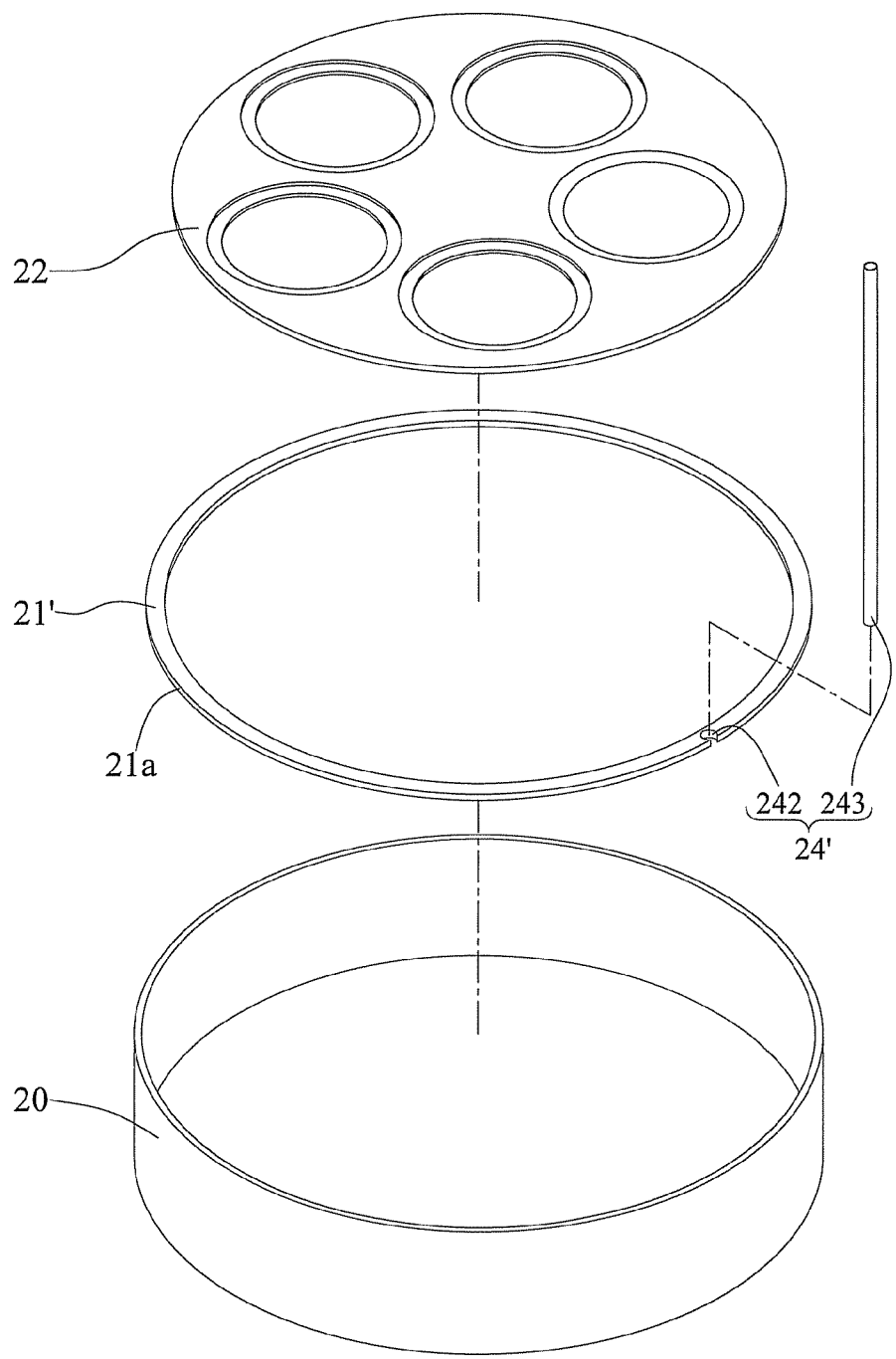
FIGS. 4A-4C are exploded views and FIG. 4B' is a cross-sectional view of a film formation system of different embodiments according to the present invention.

In another embodiment, as shown in FIG. 4A, a liquid draining device 24' comprises a vent 242 formed on a ring-shaped component 21', and a pipe body 243 that enters the container 20 through the vent 242 for siphoning, the water. The water may be pumped out with the aid of a pump.

Additionally, a groove (not shown) may be formed on an inner edge of the container 20, for enabling the pipe body 243 to enter the container 20 along the groove, and the ring-shaped component to prop against the inner edge of the container 20 and not to rotate in the container 20. Moreover, the inner edge of the container 20 does not have a complete circular arc surface and therefore has a turbulent flow effect, which may reduce the time when the water is injected until the water stops flowing. A container may also have a similar effect if it has a ring-shaped component having a hexagonal outer cross section and a circular inner cross section.

Figure 3E:
Figure 3E:
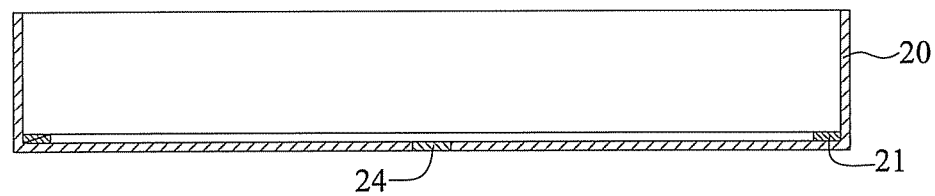

As shown in FIG. 3E, the carrying component 22 is separated from the container 20, to obtain the substrate 3 that has the film layer 30 on a surface thereon on the carrying component 22. There are many ways to separate the carrying component 22 from the container 20, such as pouring the carrying component 22 from the container 20. The film formation system 2 shown in FIGS. 4B and 4B' further comprises a separation structure 25 for separating the carrying component 22' from the container 20'.

In the embodiment, the separation structure 25 includes a clamping part 251 that is installed on the carrying component 22' and is in the shape of a through hole, allowing a robotic arm 250 to penetrate the clamping part 251 and clamp the carrying component 22' for removal out of the container 20', so as to separate the carrying component 22' from the container 20'. In the embodiment, the robotic arm 250 may have, for example, an extractable component 2521 and a reversible carrying plate 2531 reversibly connected to the extractable component 2521. The extractable component 2521 can extend out at one end of the robotic arm 250 and move towards the periphery of the carrying component 22', for providing the reversible carrying plate 2531 to prop up the carrying component 22'. However, the robotic arm 250 may be replaced by a structure having a clamping function or any other functions.

Figure 4B:
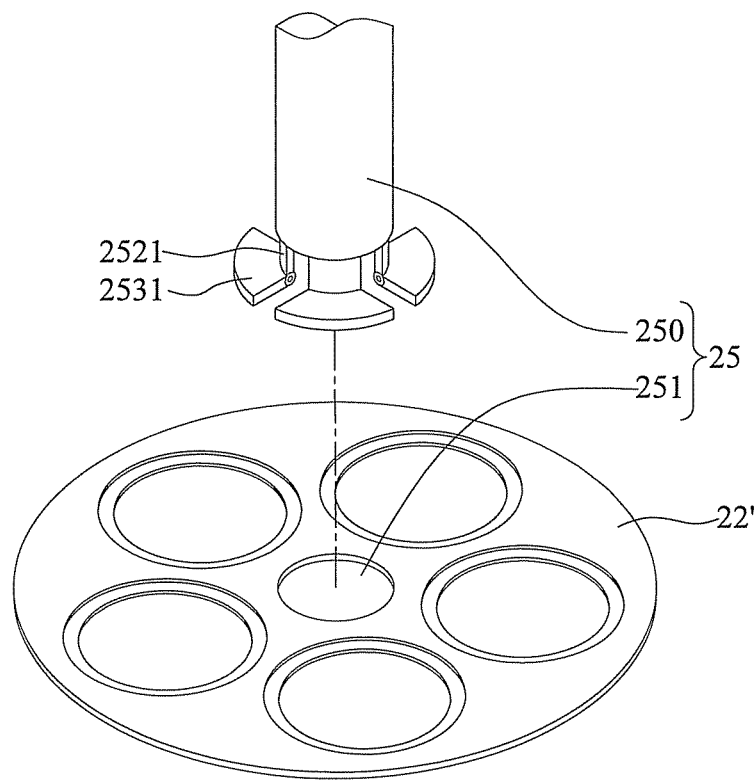
Figure 4B:
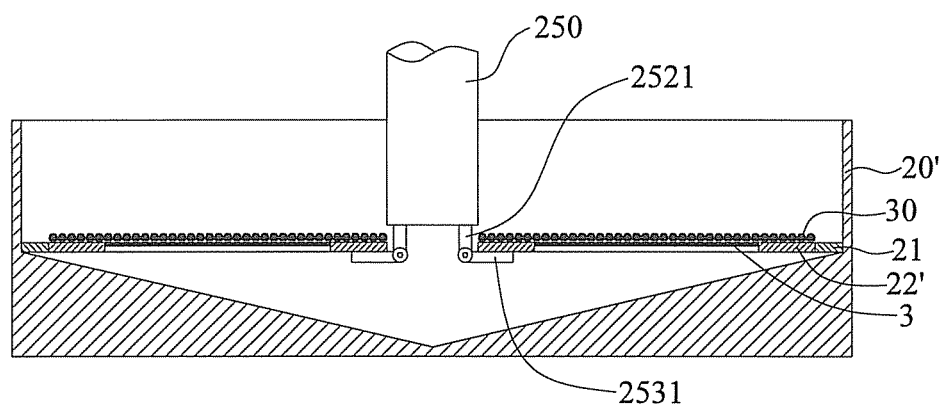

If the robotic arm 250 is used to obtain the carrying component 22', the container 20' contacts the periphery of the carrying component 22', and a gap formed between the central bottom of the carrying component 22' and the container 20' is designed for the robotic arm 250 to prop up the carrying component 22' easily. Accordingly, the bottom of the container 20' is in the shape of a cone, as shown in FIG. 4B', or may be cylindrical.

Since the embodiment of the present invention installs on the bottom of the container 20 the carrying component 22 and the substrate 3, structural damage of the film layer 30 may be avoided. Therefore, through the design of the carrying component 22, a photomask may be manufactured on a wafer having a large area, and the photomask may be manufactured for a plurality of wafers at one time, in order to satisfy various manufacturing demands.

When the carrying component 22 is obtained, if a residue of the liquid is found on the film layer 30 and the carrying component 22, the residue of the liquid may be removed in an evaporating manner, to keep the substrate 3 dry.

Figure 4C:
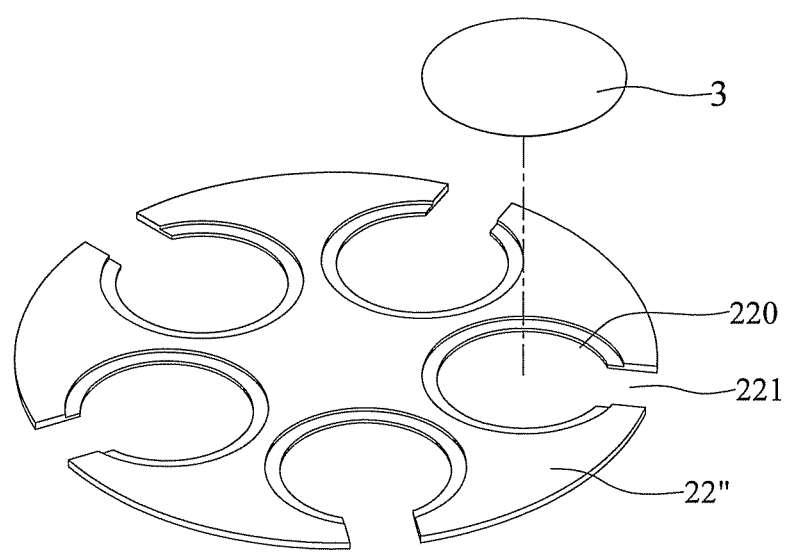

As shown in FIG. 4C, a breach 221 communicated with the hole 220 may be formed on the carrying component 22". When the carrying component 22" is separated from the container 20, the substrate 3 engaged in the hole 220 may be easily obtained via the breach 221.

Given the above, the present invention, through the installation of the ring-shaped component according to the preferred embodiments, can effectively prevent the nano-spheres from contacting the inner wall of the container and bursting. Since the nano-spheres are formed within the ring of the ring-shaped component, a photomask required for a wafer having a large area may be formed.

Moreover, the present invention, according to the preferred embodiments, first installs the carrying component on the bottom of the container, and then forms the film layer on the water surface, in order to prevent the carrying component from damaging the film layer. The present invention does not need to form the opening of the prior art for the carrying component to be installed in, and the nano-spheres may have a larger disposition area. Through the design of the carrying component, a photomask required for a wafer having a large area may be manufactured at one time, and the demands of various options may be satisfied effectively.

The foregoing descriptions of the detailed embodiments are illustrated to disclose the features and functions of the present invention and are not intended to be restrictive of the scope of the present invention. As such, it should be understood by those in the art that many modifications and variations can be made according to the spirit and principles in the disclosure of the present invention and yet still fall within the scope of the invention as specified in the appended claims.

What is claimed is:

1. A film formation system, comprising:
   a container having a bottom for containing liquid;
   a liquid draining device for draining the liquid;
   a ring-shaped component installed in the container for moving upward and downward freely and floating on the liquid;
   a carrying component installed on the bottom of the container, for carrying at least a substrate so as to immerse the substrate in the liquid;
   an injection unit that injects a film formation material on the surface of the liquid in the container to form a film layer having an edge in contact with an internal-diameter edge of the ring-shaped component; and
   a transferring device for transferring the film formation material into the container, allowing the film formation material to be formed as the film layer,
   wherein the liquid is removed by the liquid draining device so that the film layer moves downward in accordance with the ring-shaped component and is formed on the substrate.

2. The film formation system of claim 1, wherein the container is a circular, hexagonal or polygonal container.

3. The film formation system of claim 1, wherein the ring-shaped component has a leaf-like thickness.

4. The film formation system of claim 1, wherein the ring-shaped component has an external-diameter edge corresponding to an inner wall of the container.

5. The film formation system of claim 1, wherein the carrying component has a contour corresponding to the internal-diameter edge of the ring-shaped component.

6. The film formation system of claim 1, wherein the carrying component comprises a hydrophilic material.

7. The film formation system of claim 1, wherein the carrying component comprises stainless steel.

8. The film formation system of claim 1, wherein the carrying component has a rough surface.

9. The film formation system of claim 1, wherein the substrate is a wafer.

10. The film formation system of claim 1, wherein the film formation material comprises nano-spheres and aqueous alcohol solution.

11. The film formation system of claim 10, wherein the transferring device contains the film formation material.

12. The film formation system of claim 1, wherein the liquid draining device has a water draining hole penetrating the container and a plug for plugging the water draining hole.

13. The film formation system of claim 12, wherein the liquid draining device further comprises an evaporator.

14. The film formation system of claim 1, wherein the liquid draining device has a water draining hole penetrating the container, a water draining pipe connected to the water draining hole for guiding the flow direction of the liquid, and a stop valve for controlling the flow rate of the liquid.

15. The film formation system of claim 1, wherein the liquid draining device comprises a pipe body that enters the container.

16. The film formation system of claim 1 further comprising a separation structure for separating the carrying component from the container.

17. The film formation system of claim 16, wherein the separation structure includes a clamping part installed on the carrying component, allowing a robotic arm to clamp the carrying component to separate the carrying component from the container.

18. The film formation system of claim 17, wherein a gap is formed between the container and the carrying component, for the robotic arm to easily clamp the carrying component.

* * * * *